(12) United States Patent
Prasad

(10) Patent No.: US 8,026,760 B1
(45) Date of Patent: Sep. 27, 2011

(54) GAIN ENHANCED SWITCHED CAPACITOR CIRCUIT AND METHOD OF OPERATION

(75) Inventor: Ammisetti V. Prasad, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/846,475

(22) Filed: Jul. 29, 2010

(51) Int. Cl.
H03F 1/02 (2006.01)

(52) U.S. Cl. .............................. 330/9; 330/51; 330/311

(58) Field of Classification Search ............... 330/9, 51, 330/311
See application file for complete search history.

(56) References Cited

U.S. PATENT DOCUMENTS

| 5,495,200 | A |   | 2/1996  | Kwan et al.         |
|-----------|---|---|---------|---------------------|
| 5,523,719 | A | * | 6/1996  | Longo et al. ....... 327/557 |
| 5,847,600 | A |   | 12/1998 | Brooks et al.       |
| 5,973,536 | A | * | 10/1999 | Maejima ........... 327/337 |
| 6,097,248 | A | * | 8/2000  | Segami ............. 330/9  |
| 6,437,608 | B1 | * | 8/2002 | Miyabe et al. ..... 327/96 |
| 6,812,787 | B2 | * | 11/2004 | Kimura .............. 330/69 |
| 7,295,143 | B2 | * | 11/2007 | Ambo et al. ....... 341/172 |
| 7,639,073 | B2 | * | 12/2009 | Deng et al. ........ 330/9  |
| 2002/0030544 | A1 | * | 3/2002 | Kulhalli et al. ... 330/301 |

OTHER PUBLICATIONS

ENZ et al.; "Circuit Techniques for Reducing the Effects of Op-Amp Imperfections: Autozeroing, Correlated Double Sampling, and Chopper Stablization"; Proceedings of the IEEE; Nov. 1996; pp. 1584-1614; vol. 84, No. 11; IEEE.

* cited by examiner

*Primary Examiner* — Patricia Nguyen
(74) *Attorney, Agent, or Firm* — Joanna G. Chiu; James L. Clingan, Jr.

(57) ABSTRACT

A switched capacitor circuit utilizes a pair of serially connected differential amplifiers that have plus inputs, minus inputs, plus outputs, and minus outputs. Feedback to the plus/minus inputs is in a first configuration relative to the output of the pair of differential amplifiers in a sampling mode and a second configuration in a hold mode. Similarly, the plus/minus inputs relative to the plus/minus outputs of the serially connected differential amplifiers is reversed between the sampling and hold modes.

20 Claims, 5 Drawing Sheets

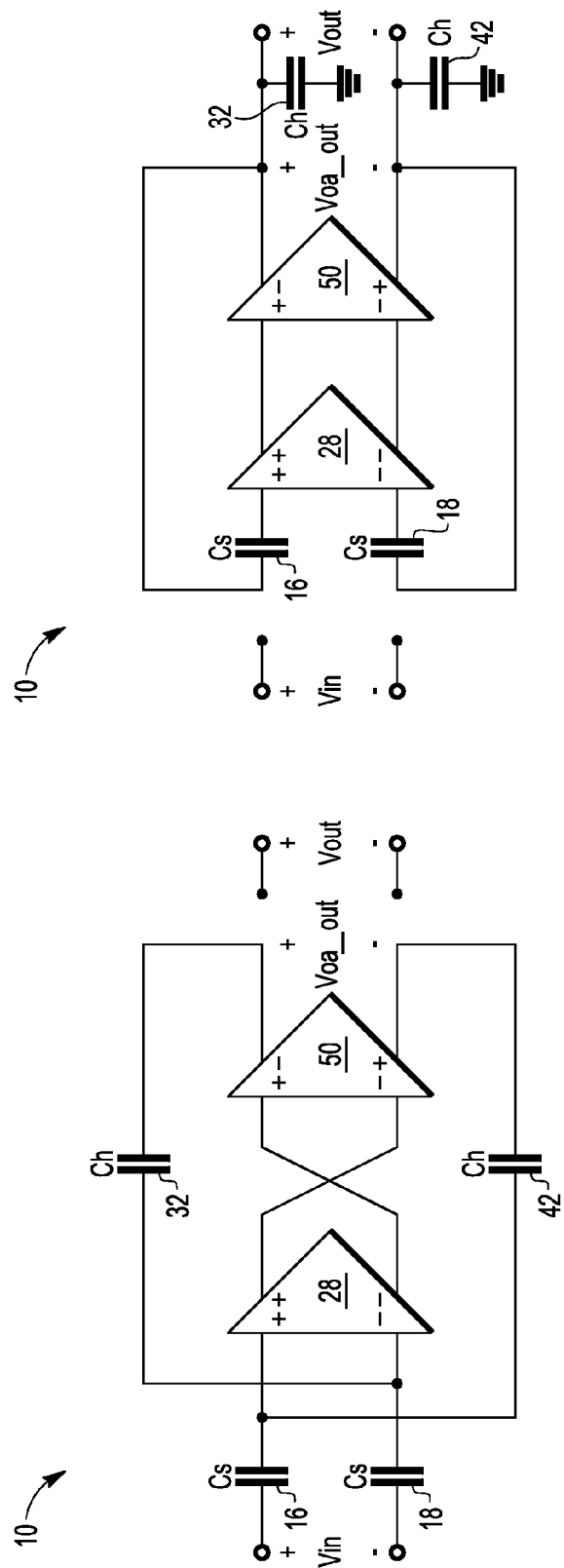

GAIN ENHANCED SWITCHED CAPACITOR CIRCUIT AND METHOD OF OPERATION

BACKGROUND

1. Field

This disclosure relates generally to switched capacitor circuits, and more specifically, to a gain enhanced switched capacitor circuit.

2. Related Art

Switched capacitor circuits are commonly used in mixed signal circuitry, such as to form buffers, gain stages, integrators, etc. For example, a switched capacitor circuit is commonly used within a sample and hold circuit. One type of switched capacitor circuit available today is a gain enhanced switched capacitor circuit. In such a gain enhanced switched capacitor circuit, the input is sampled with respect to virtual ground of a closed loops amplifier; however, an inverting configuration (which results in a negative integration) in the sampling phase is utilized. This negative integration causes the output of the circuit to move in the opposite direction to what is desired. This, in turn, increases the slew rate requirement of the operational amplifier during transition from the sampling phase to the holding phase, which limits the speed of the circuit. Therefore, a need exists for an improved gain enhanced switched capacitor circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 2 illustrates, in circuit schematic form, the enhanced gain switched capacitor circuit of FIG. 1 during a sampling phase, in accordance with one embodiment FIG. 3 illustrates, in circuit schematic form, the enhanced gain switched capacitor circuit of FIG. 2 during a holding phase, in accordance with one embodiment.

DETAILED DESCRIPTION

In one embodiment, a gain enhanced switched capacitor circuit has a differential input and provides a differential output and operates as a sample and hold circuit having a sampling phase and a holding/gain phase. In one embodiment, the gain enhanced switched capacitor circuit is used in a buffer configuration having a sampling phase and a holding phase. In another embodiment, the gain enhanced switched capacitor circuit is used in a gain configuration. In either configuration, during the sampling phase, the input voltage is sampled across the sampling capacitors with respect to virtual ground. In the buffer configuration, during the holding phase, the sampled voltage is held across the operational amplifier. In the gain configuration, during the gain phase, the sampled voltage is amplified. In either configuration, during the sampling phase, the holding capacitors are cross-coupled which allows for the output to track the input. Furthermore, during the sampling phase in either configuration, the output of the differential amplifier is inverted in order to maintain an overall negative feedback. This may reduce the slew rate requirement of the operation amplifier during the transition from the sampling phase to the holding/gain phase.

Note that, as used herein, when a switch is referred to as open or off, it is in a non-conductive state, and when a switch is referred to as closed or on, it is in a conductive state. Therefore, when a switch is open or off, its terminals are decoupled from each other (i.e. not coupled), and when a switch is closed or on, its terminals are coupled to each other.

Figure 1:
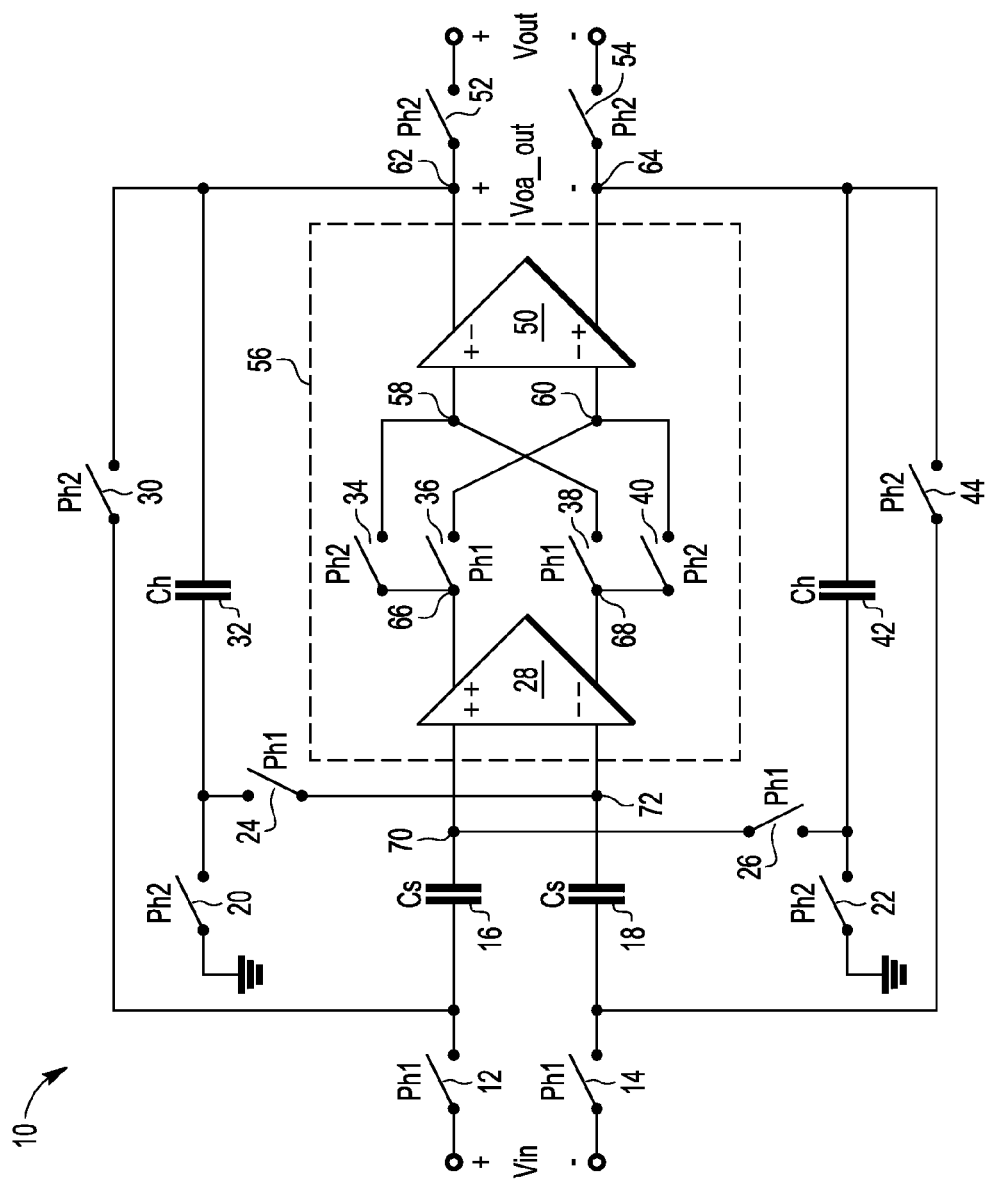
FIG. 1 illustrates, in circuit schematic form, an enhanced gain switched capacitor circuit in a buffer configuration in accordance with one embodiment.

FIG. 1 illustrates, in circuit schematic form, an enhanced gain switched capacitor circuit 10 in a buffer configuration in accordance with one embodiment. Circuit 10 includes differential amplifiers 28 and 50, sampling capacitors, Cs, 16 and 18, holding capacitors, Ch, 32 and 42, phase 1 (Ph1) switches 12, 14, 24, 26, 36, and 38, and phase 2 (Ph2) switches 20, 22, 34, 40, 30, 44, 52, and 54. Circuit 10 includes a differential input, Vin, and a differential output, Vout. Therefore, a pair of signals may be provided to the differential input, where a first signal of the pair can be provided to a first input which is connected to a first terminal of Ph1 switch 12, and a second signal of the pair can be provided to a second input which is connected to a first terminal of Ph1 switch 14. A second terminal of Ph1 switch 12 is connected to a first terminal of Cs 16 and a first terminal of Ph2 switch 30. A second terminal of Ph1 switch 14 is connected to a first terminal of Cs 18 and a first terminal of Ph2 switch 44. A second terminal of Ph2 switch 30 is connected to a circuit node 62 and a second terminal of Ph2 switch 44 is connected to a circuit node 64. Circuit node 62 is connected to a first terminal of Ph2 switch 52, and circuit node 64 is connected to a first terminal of Ph2 switch 54. A second terminal of Ph2 switch 52 provides a first output of circuit 10 and a second terminal of Ph2 switch 54 provides a second output of circuit 10. The first and second outputs of circuit 10 provide the differential output, Vout, of circuit 10. A second terminal of Cs 16 is connected to a circuit node 70, and a second terminal of Cs 18 is connected to a circuit node 72. Circuit node 70 is connected to a first input (i.e. a plus input) of differential amplifier 28 and a first terminal of Ph1 switch 26, and circuit node 72 is coupled to a second input (i.e. a minus input) of differential amplifier 28 and a first terminal of Ph1 switch 24. A second terminal of Ph1 switch 26 is coupled to a first terminal of Ph2 switch 22 and to a first terminal of Ch 42. A second terminal of Ph1 switch 24 is connected to a first terminal of Ph2 switch 20 and to a first terminal of Ch 32. A second terminal of Ph2 switch 22 is connected to ground, and a second terminal of Ph2 switch 20 is connected to ground. A second terminal of Ch 42 is connected to circuit node 64, and a second terminal of Ch 32 is connected to circuit node 62. A first output (i.e. a plus output) of differential amplifier 28 is connected to a circuit node 66, and a second output (i.e. a minus output) of differential amplifier 28 is connected to a circuit node 68. Circuit node 66 is connected to a first terminal of Ph2 switch 34 and a first terminal of Ph1 switch 36, and circuit node 68 is connected to a first terminal of Ph1 switch 38 and a first terminal of Ph2 switch 40. A second terminal of Ph2 switch 34 is connected to a circuit node 58, a second terminal of Ph1 switch 36 is connected to a circuit node 60, a second terminal of Ph1 switch 38 is connected to circuit node 58, and a second terminal of Ph2 switch 40 is connected to circuit node 60. Circuit node 58 is connected to a first input (i.e. a plus input) of differential amplifier 50, and circuit node 60 is connected to a second input (i.e. a minus input) of differential amplifier 50. A first output (i.e. a minus output) of differential amplifier 50 is connected to circuit node 62, and a second output (i.e. a plus output) of differential amplifier 50 is connected to circuit node 64. Circuit 10 includes an operational amplifier 56 which includes differential amplifiers 28 and 50, in which circuit node 70 is a first input of operational amplifier 56 and circuit node 72 is a second input of operational amplifier 56. Circuit node 62 is a first output of operational amplifier 56, and circuit node 64 is a second output of operational amplifier 56. Therefore, circuit nodes 70 and 72 provide a differential input to operational amplifier 56, and circuit nodes 62 and 64 provide a differential output of operational amplifier 56, Voa_out. For example, in one embodiment, node 62 provides a plus output and circuit node 64 provides a minus output.

Operation of circuit 10 will be described in reference to FIGS. 2, 3, and 4. Circuit 10 represents a buffer configuration and operates as a sample and hold circuit having a sampling phase and a holding phase. During the sampling phase, each of the Ph1 switches are closed and each of the Ph2 switches are open, and, during the holding phase, each of the Ph2 switches are closed and each of the Ph1 switches are open. FIG. 2 illustrates circuit 10 during the sampling phase, and FIG. 3 illustrates circuit 10 during the holding phase. Note that each of the sample phase and the holding phase of circuit 10 may be referred to as a sample mode and a hold mode, respectively, of circuit 10. During operation, circuit 10 alternates between the sampling phase and the holding phase. Note that the control signals which control each of the Ph1 and Ph2 switches are not illustrated in FIGS. 1-3. Furthermore, the control signals are generated such that the sampling and holding phases of circuit 10 do not overlap. That is, when transitioning from the sampling phase to the holding phase, the Ph1 switches are first opened prior to closing the Ph2 switches, and, when transitioning from the holding phase to the sampling phase, the Ph2 switches are opened prior to closing the Ph1 switches. Furthermore, all of the Ph1 switches may or may not be opened or closed at the same time during the transitions. Similarly, all of the Ph2 switches may or may not be opened or closed at the same time during the transitions.

FIG. 2 illustrates circuit 10 as it is connected during the sampling phase in which the Ph1 switches are closed and the Ph2 switches are opened. That is, each of the Ph1 switches are illustrated as shorts and the Ph2 switches are illustrated as opens. In one embodiment, the Ph2 switches are opened prior to closing the Ph1 switches. Also, in one embodiment, some Ph2 switches, such as Ph2 switches 20 and 22, are opened prior to opening the other Ph2 switches, such as Ph2 switches 30 and 44. The first input of circuit 10 is coupled to the first terminal of Cs 16 (via closed Ph1 switch 12), and the second input of circuit 10 is coupled to the first terminal of Cs 18 (via closed Ph1 switch 14). The second terminal of Cs 16 is coupled to the plus input of differential amplifier 28, and the second terminal of Cs 18 is coupled to the minus input of differential amplifier 28. The second terminal of Cs 16 is also coupled to the first terminal of Ch 42 (via closed Ph1 switch 26), and the second terminal of Cs 18 is coupled to the first terminal of Ch 32 (via closed Ph1 switch 24). Also, the plus output of differential amplifier 28 is coupled to the minus input of differential amplifier 50 (via closed Ph1 switch 36) and the minus output of differential amplifier 28 is coupled to the plus input of differential amplifier 50 (via closed Ph1 switch 38). Therefore, during the sampling phase, the input voltage at Vin, which is provided by a pair of differential signals, is sampled across the sampling capacitors, Cs 16 and 18, with respect to virtual ground (by way of differential amplifier 28). Also, note that the inputs to differential amplifier 28 are cross-coupled to the holding capacitors such that the plus input of differential amplifier 28 is connected to the first terminal of Ch 42 rather than the first terminal of Ch 32, and the second terminal of Ch 32 is connected to the minus output of differential amplifier 50. Similarly, the minus input of differential amplifier 28 is connected to the first terminal of Ch 32 rather than the first terminal of Ch 42, and the second terminal of Ch 42 is connected to the plus output of differential amplifier 50. This allows for the output of differential amplifier 56, Voa_out, to track Vin without inversion. However, since the inputs of differential amplifier 28 have been cross-coupled, the outputs of differential amplifier 28 are cross-coupled to the inputs of differential amplifier 50 to remove the positive feedback introduced by the cross-coupling of the inputs of differential amplifier 28. Therefore, in each closed loop during the sampling phase, only one inversion (i.e. an odd number of inversions) is introduced. Note that Ph2 switches 52 and 54 are open during the sampling phase, thus decoupling Vout from Voa_out. In this manner, Vout is not affected by Voa_out during the sampling phase. Example waveforms will be described in reference to FIG. 4 below.

FIG. 3 illustrates circuit 10 as it is connected during the holding phase in which the Ph2 switches are closed and the Ph1 switches are opened. That is, each of the Ph2 switches are illustrated as shorts and the Ph1 switches are illustrated as opens. In one embodiment, the Ph1 switches are opened prior to closing the Ph2 switches. Also, in one embodiment, some Ph2 switches, such as Ph2 switches 20 and 22, are closed prior to closing the other Ph2 switches, such as Ph2 switches 30 and 44. The input of circuit 10 is decoupled from the first terminals of Cs 16 and 18 and the sampled voltage (which previously sampled during the sampling phase) is held across operational amplifier 56 (across differential amplifiers 28 and 50). Therefore, the first terminal of Cs 16 is coupled to the minus output of differential amplifier 50 (via closed Ph2 switch 30), and the first terminal of Cs 18 is coupled to the plus output of differential amplifier 50 (via closed Ph2 switch 44). Also, in order to maintain only one inversion (or an odd number of inversions), the outputs of differential amplifier 28 are no longer cross-coupled to the inputs of differential amplifier 50. That is, the plus output of differential amplifier 28 is coupled to the plus input of differential amplifier 50 (via closed Ph2 switch 34), and the minus output of differential amplifier 28 is coupled to the minus input of differential amplifier 50 (via closed Ph2 switch 40). Also, the second terminal of Ch 32 is coupled to a reference (e.g. ground) via closed Ph2 switch 20, and the second terminal of Ch 42 is coupled to the reference (e.g. ground) via closed Ph2 switch 22. During the holding phase, Vout is held at the same voltage as Voa_out. Example waveforms will be described in reference to FIG. 4 below.

In each of FIGS. 1-3, operational amplifier 56 is illustrated as having 2 stages, a first one corresponding to differential amplifier 28 and a second corresponding to differential amplifier 50. Also, in order to maintain an odd number of inversions, the connections between the stages are cross-coupled, as needed, during the sampling phase. In alternate embodiments, any number of stages may be present. For example, in one alternate embodiment, only one stage is present, such as differential amplifier 28. In this case, differential amplifier 50 would not be present, and circuit node 58 is connected to circuit node 64, and circuit node 60 is connected to circuit node 62. That is, note that regardless of whether differential amplifier 50 is present or not, circuit node 58 is in phase with circuit node 64 and out of phase with circuit node 62, and, similarly, circuit node 60 is in phase with circuit node 62 and output of phase with circuit node 64. Also, note that if more than 2 stages are implemented, the cross-coupling between the stages during the holding phase to maintain an odd number of inversions in the feedback may be implemented, as needed.

Figure 4:
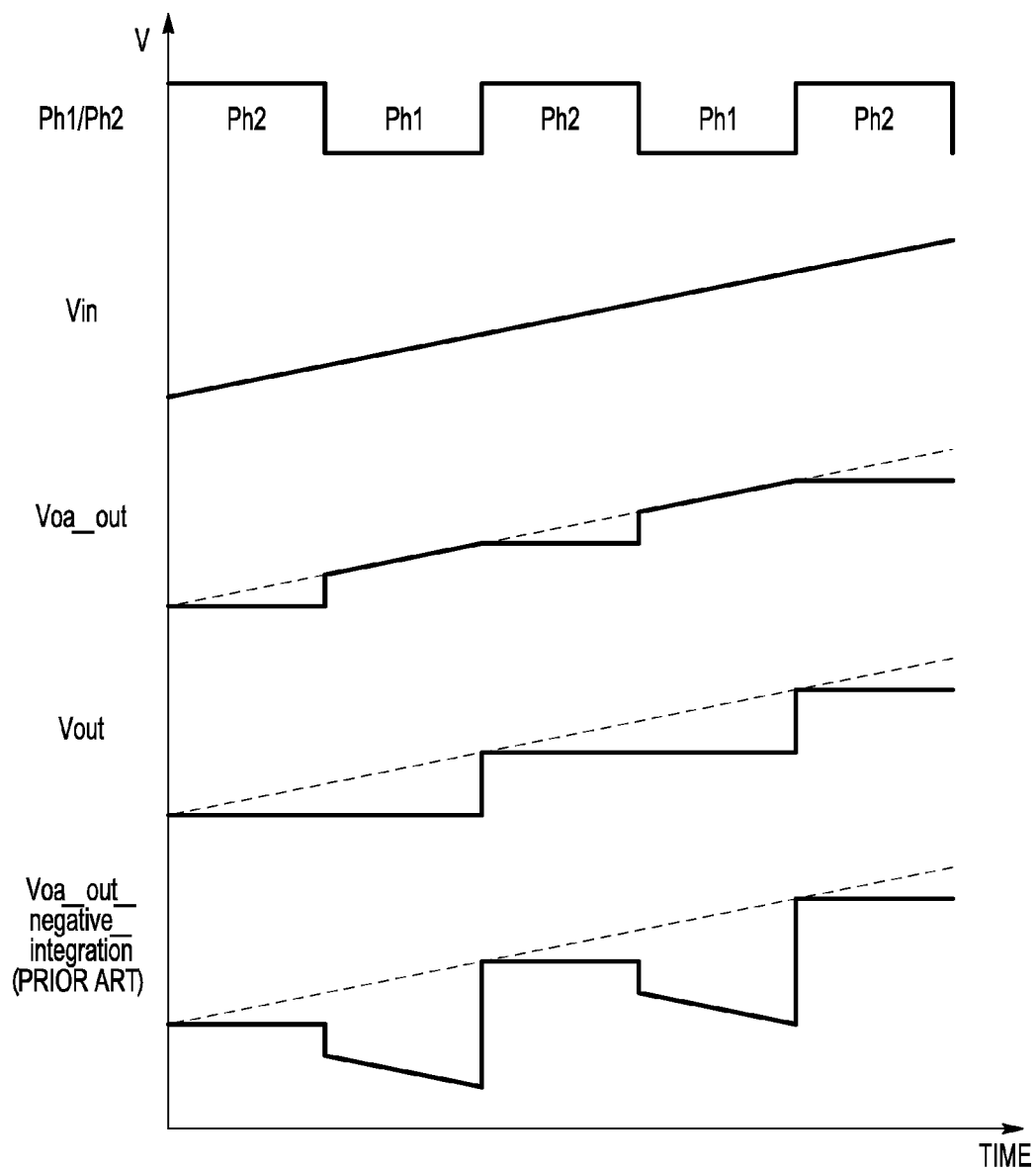
FIG. 4 illustrates, in timing diagram format, example waveforms corresponding to the circuit of FIG. 1 and a waveform corresponding to a prior art gain enhanced switched capacitor utilizing negative integration.

FIG. 4 illustrates, in timing diagram form, example waveforms of circuit 10 of FIG. 1. FIG. 4 includes an example waveform for differential input, Vin, for the differential output of operational amplifier 56 (across nodes 62 and 64), Voa_out, and for the differential output of circuit 10, Vout. FIG. 4 also includes an example waveform for a prior art gain enhanced switched capacitor circuit which utilizes negative integration, Voa_out_negative_integration. In FIG. 4, five example phases are illustrated, beginning with a holding phase (Ph2), then a sampling phase (Ph1), followed by another holding phase (Ph2), then another sampling phase (Ph1), and another holding phase (Ph2). Note that Vin is provided as a linearly increasing input voltage, which is provided by the pair of differential signals provided to the first terminals of sampling capacitors 16 and 18. The dotted lines in each of the subsequent waveforms represents Vin, and is provided for ease of comparison. Note that waveform Voa_out holds its voltage value during the holding phases, and tracks Vin during the sampling phases. Vout of circuit 10, however, due to switches 52 and 54 which are only closed during the holding phases holds its voltage value during both the holding phase and the sampling phase, in which, at the end of the sampling phase, tracks Vin before being held again during the next holding phase. The waveform Voa_out_negative_integration also holds its voltage value during the holding phases, as does Voa_out; however, note that during the sampling phases, the waveform tracks the inverse of Vin (i.e. −Vin), thus causing the voltage to diverge from Vin. Therefore, at the end of each sampling phase, the waveform must return to Vin to hold the current voltage value of Vin again. This return to Vin is more difficult for an operational amplifier to handle, requiring extra power and area, as compared to the smaller return to Vin at the transition of the sampling phase to the holding phase of Voa_out of the embodiment of FIG. 1. Therefore, note that the circuit of FIG. 1 may allow for improved operation while allowing for reduced area and power as compared to the prior art operational amplifiers within the gain enhanced switched capacitor circuit. For example, the circuit of FIG. 1 may reduce the slew rate requirement of operational amplifier 56 during the transition from the sampling to holding phase, thus reducing power.

Figure 5:
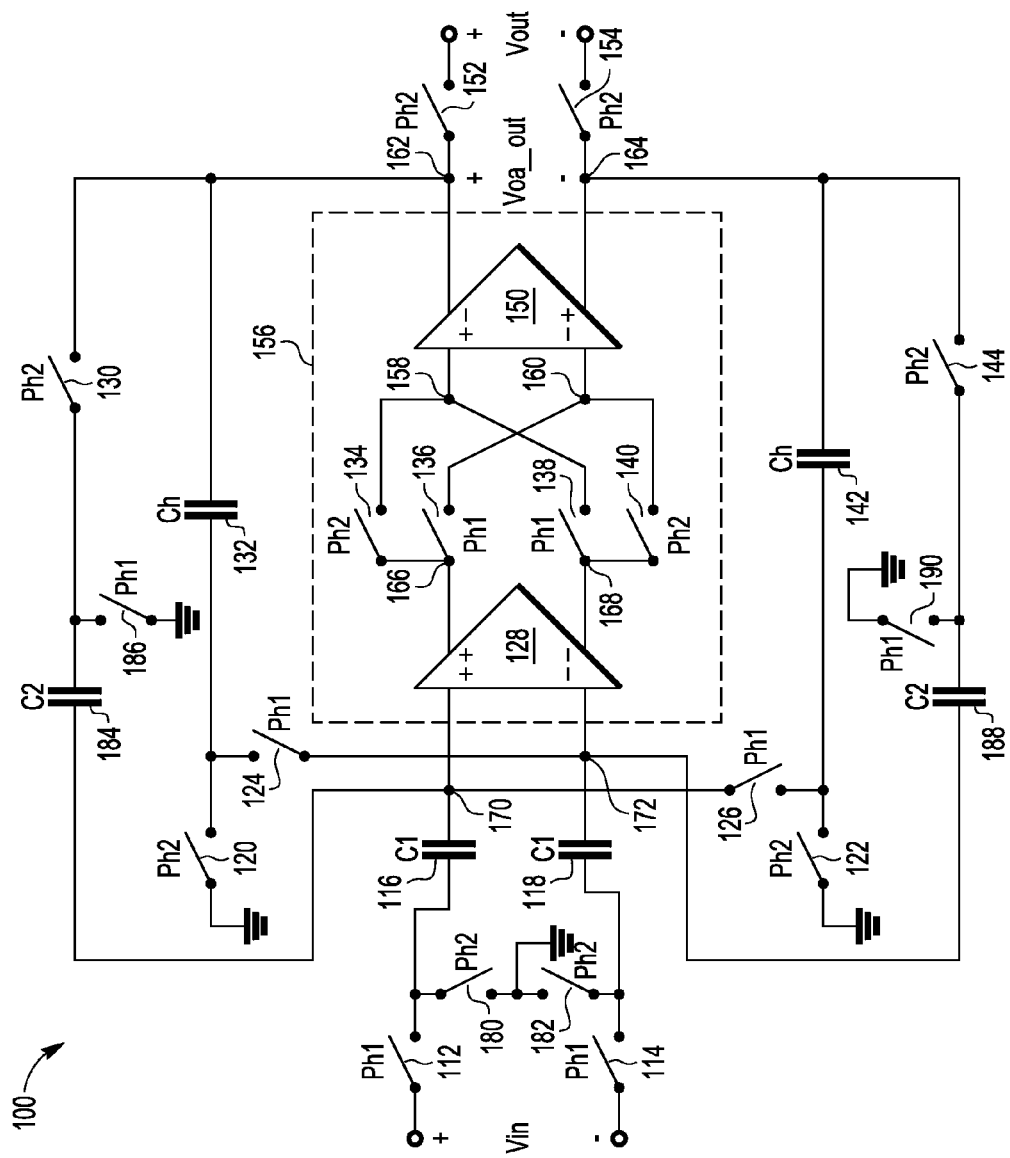
FIG. 5 illustrates, in circuit schematic form, an enhanced gain switched capacitor circuit in a gain configuration in accordance with one embodiment.

FIG. 5 illustrates, in circuit schematic form, an enhanced gain switched capacitor circuit 100 in a gain configuration in accordance with one embodiment. Circuit 100 includes differential amplifiers 128 and 150, C1 capacitors 116 and 118, C2 capacitors 184 and 188, holding capacitors, Ch, 132 and 143, phase 1 (Ph1) switches 112, 114, 124, 126, 136, 138, 186, and 190, and phase 2 (Ph2) switches 120, 122, 134, 140, 130, 144, 152, 154, 180, and 182. Circuit 100 includes a differential input, Vin, and a differential output, Vout. Therefore, a pair of signals may be provided to the differential input, where a first signal of the pair can be provided to a first input which is connected to a first terminal of Ph1 switch 112, and a second signal of the pair can be provided to a second input which is connected to a first terminal of Ph1 114. A second terminal of Ph1 112 is connected to a first terminal of C1 116 and a first terminal of Ph2 180. A second terminal of Ph1 114 is connected to a first terminal of C1 118 and a first terminal of Ph2 182. A second terminal of Ph2 180 is connected to a second terminal of Ph2 182 and to ground. A second terminal of C1 116 is connect to a circuit node 170, and a second terminal of C1 118 is connected to a circuit node 172. A first terminal of C2 184 is connect to circuit node 170, a second terminal of C2 184 is connected to a first terminal of Ph1 switch 186 and to a first terminal of Ph2 switch 130. A second terminal of Ph1 switch 186 is connected to ground. A first terminal of C2 188 is connect to circuit node 172, a second terminal of C2 188 is connected to a first terminal of Ph1 switch 190 and to a first terminal of Ph2 switch 144. A second terminal of Ph1 switch 190 is connected to ground. A second terminal of Ph2 130 is connected to a circuit node 162 and a second terminal of Ph2 switch 144 is connected to a circuit node 164. Circuit node 162 is connected to a first terminal of Ph2 switch 152, and circuit node 164 is connected to a first terminal of Ph2 switch 154. A second terminal of Ph2 switch 152 provides a first output of circuit 100 and a second terminal of Ph2 switch 154 provides a second output of circuit 100. The first and second outputs of circuit 100 provide the differential output, Vout, of circuit 100. Circuit node 170 is connected to a first input (i.e. a plus input) of differential amplifier 128 and a first terminal of Ph1 switch 126, and circuit node 172 is coupled to a second input (i.e. a minus input) of differential amplifier 128 and a first terminal of Ph1 switch 124. A second terminal of Ph1 switch 126 is coupled to a first terminal of Ph2 switch 122 and to a first terminal of Ch 142. A second terminal of Ph1 switch 124 is connected to a first terminal of Ph2 switch 120 and to a first terminal of Ch 132. A second terminal of Ph2 switch 122 is connected to ground, and a second terminal of Ph2 switch 120 is connected to ground. A second terminal of Ch 142 is connected to circuit node 164, and a second terminal of Ch 132 is connected to circuit node 162. A first output (i.e. a plus output) of differential amplifier 128 is connected to a circuit node 166, and a second output (i.e. a minus output) of differential amplifier 128 is connected to a circuit node 168. Circuit node 166 is connected to a first terminal of Ph2 switch 134 and a first terminal of Ph1 switch 136, and circuit node 168 is connected to a first terminal of Ph1 switch 138 and a first terminal of Ph2 switch 140. A second terminal of Ph2 switch 134 is connected to a circuit node 158, a second terminal of Ph1 switch 136 is connected to a circuit node 160, a second terminal of Ph1 switch 138 is connected to circuit node 158, and a second terminal of Ph2 switch 140 is connected to circuit node 160. Circuit node 158 is connected to a first input (i.e. a plus input) of differential amplifier 150, and circuit node 160 is connected to a second input (i.e. a minus input) of differential amplifier 150. A first output (i.e. a minus output) of differential amplifier 150 is connected to circuit node 162, and a second output (i.e. a plus output) of differential amplifier 150 is connected to circuit node 164. Circuit 100 includes an operational amplifier 156 which includes differential amplifiers 128 and 150, in which circuit node 170 is a first input of operational amplifier 156 and circuit node 172 is a second input of operational amplifier 156. Circuit node 162 is a first output of operational amplifier 156, and circuit node 164 is a second output of operational amplifier 156. Therefore, circuit nodes 170 and 172 provide a differential input to operational amplifier 156, and circuit nodes 162 and 164 provide a differential output of operational amplifier 156, Voa_out. For example, in one embodiment, node 162 provides a plus output and circuit node 164 provides a minus output.

Figure 7:
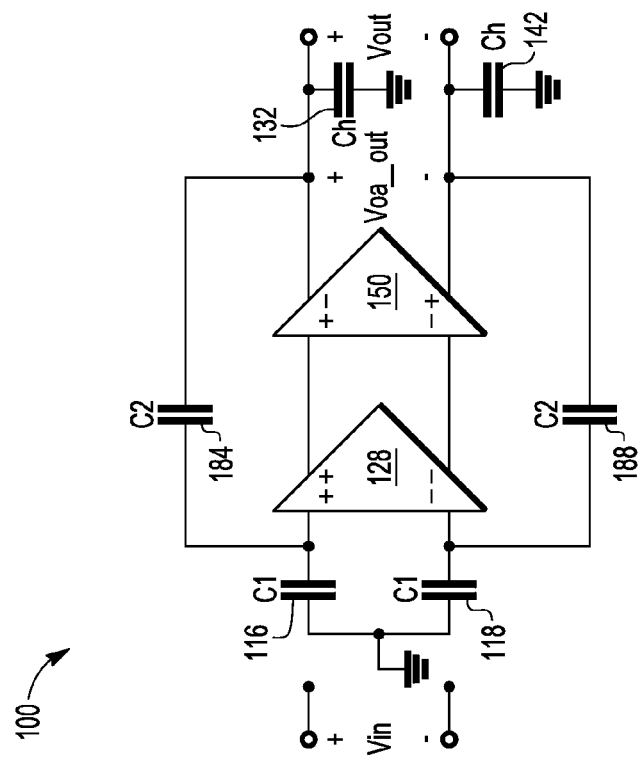
FIG. 7 illustrates, in circuit schematic form, the enhanced gain switched capacitor circuit of FIG. 5 during a gain phase, in accordance with one embodiment.
Figure 6:
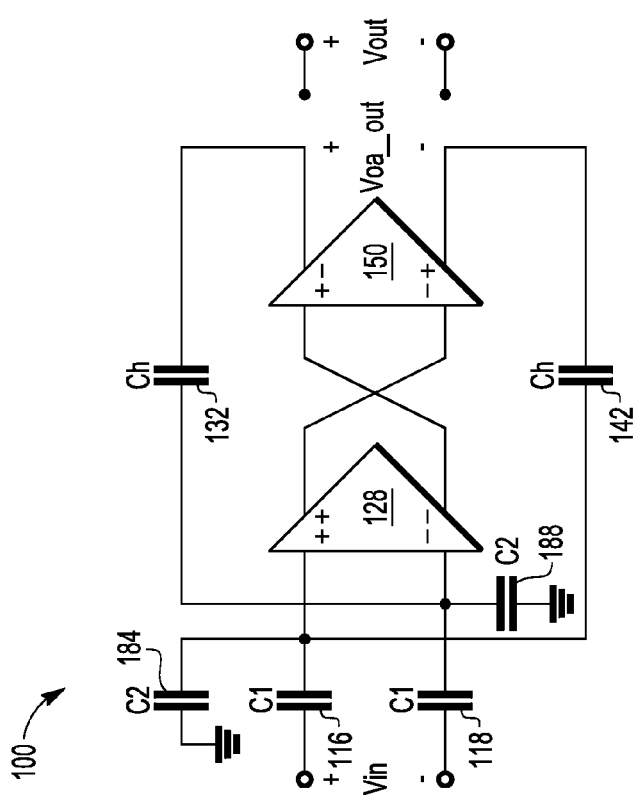
FIG. 6 illustrates, in circuit schematic form, the enhanced gain switched capacitor circuit of FIG. 5 during a sampling phase, in accordance with one embodiment

Operation of circuit 100 will be described in reference to FIGS. 6 and 7. Circuit 100 represents a gain configuration and operates as a sample and hold circuit having a sampling phase and a holding/gain phase (also referred to as a gain phase). During the sampling phase, each of the Ph1 switches are closed and each of the Ph2 switches are open, and, during the gain phase, each of the Ph2 switches are closed and each of the Ph1 switches are open. FIG. 6 illustrates circuit 100 during the sampling phase, and FIG. 7 illustrates circuit 100 during the gain phase. Note that each of the sample phase and the gain phase of circuit 100 may be referred to as a sample mode and a hold mode, respectively, of circuit 10. During operation, circuit 100 alternates between the sampling phase and the gain phase. Note that the control signals which control each of the Ph1 and Ph2 switches are not illustrated in FIGS. 5-7. Furthermore, the control signals are generated such that the sampling and gain phases of circuit 100 do not overlap. That is, when transitioning from the sampling phase to the gain phase, the Ph1 switches are first opened prior to closing the Ph2 switches, and, when transitioning from the gain phase to the sampling phase, the Ph2 switches are opened prior to closing the Ph1 switches. Furthermore, all of the Ph1 switches may or may not be opened or closed at the same time during the transitions. Similarly, all of the Ph2 switches may or may not be opened or closed at the same time during the transitions.

FIG. 6 illustrates circuit 100 as it is connected during the sampling phase in which the Ph1 switches are closed and the Ph2 switches are opened. That is, each of the Ph1 switches are illustrated as shorts and the Ph2 switches are illustrated as opens. In one embodiment, the Ph2 switches are opened prior to closing the Ph1 switches. Also, in one embodiment, some Ph2 switches, such as Ph2 switches 120 and 122, are opened prior to opening the other Ph2 switches, such as Ph2 switches 130 and 144. The first input of circuit 100 is coupled to the first terminal of C1 116 (via closed Ph1 switch 112), and the second input of circuit 100 is coupled to the first terminal of C1 118 (via closed Ph1 switch 114). The second terminal of C1 116 is coupled to the first terminal of C2 184 and the plus input of differential amplifier 128, and the second terminal of C1 118 is coupled to the first terminal of C2 188 and is coupled to the minus input of differential amplifier 128. The second terminal of C2 184 is coupled to ground (via closed Ph1 switch 186), and the second terminal of C2 188 is coupled to ground (via closed Ph1 switch 190). The second terminal of C1 116 is also coupled to the first terminal of Ch 142 (via closed Ph1 switch 126), and the second terminal of C1 118 is coupled to the first terminal of Ch 132 (via closed Ph1 switch 124). Also, the plus output of differential amplifier 128 is coupled to the minus input of differential amplifier 150 (via closed Ph1 switch 136) and the minus output of differential amplifier 128 is coupled to the plus input of differential amplifier 150 (via closed Ph1 switch 138). Therefore, during the sampling phase, the input voltage at Vin, which is provided by a pair of differential signals, is sampled across the sampling capacitors C1 116 and C2 118, providing a gain of C1/C2. Also, note that the inputs to differential amplifier 128 are cross-coupled to the holding capacitors such that the plus input of differential amplifier 128 is connected to the first terminal of Ch 142 rather than the first terminal of Ch 132, and the second terminal of Ch 132 is connected to the minus output of differential amplifier 150. Similarly, the minus input of differential amplifier 128 is connected to the first terminal of Ch 132 rather than the first terminal of Ch 142, and the second terminal of Ch 142 is connected to the plus output of differential amplifier 150. This allows for the output of differential amplifier 156, Voa_out, to track Vin multiplied by the gain C1/C2, without inversion. However, since the inputs of differential amplifier 128 have been cross-coupled, the outputs of differential amplifier 128 are cross-coupled to the inputs of differential amplifier 150 to remove the positive feedback introduced by the cross-coupling of the inputs of differential amplifier 128. Therefore, in each closed loop during the sampling phase, only one inversion (i.e. an odd number of inversions) is introduced. Note that Ph2 switches 152 and 154 are open during the sampling phase, thus decoupling Vout from Voa_out. In this manner, Vout is not affected by Voa_out during the sampling phase.

FIG. 7 illustrates circuit 100 as it is connected during the gain phase in which the Ph2 switches are closed and the Ph1 switches are opened. That is, each of the Ph2 switches are illustrated as shorts and the Ph1 switches are illustrated as opens. In one embodiment, the Ph1 switches are opened prior to closing the Ph2 switches. Also, in one embodiment, some Ph2 switches, such as Ph2 switches 120 and 122, are closed prior to closing the other Ph2 switches, such as Ph2 switches 130 and 144. The input of circuit 100 is decoupled from the first terminals of C1 116 and 118 and the charge on C1 is transferred to C2 in order to amplify Vin. Therefore, the second terminal of C1 116 is coupled to the plus input of differential amplifier 128 and to the first terminal of C2 184, and the second terminal of C2 184 is coupled to the minus output of differential amplifier 150 (via closed Ph2 switch 130). Similarly, the second terminal of C1 118 is coupled to the minus input of differential amplifier 128 and to the first terminal of C2 188, and the second terminal of C2 188 is coupled to the plus output of differential amplifier 150 (via closed Ph2 switch 144). Also, in order to maintain only one inversion (or an odd number of inversions), the outputs of differential amplifier 128 are no longer cross-coupled to the inputs of differential amplifier 150. That is, the plus output of differential amplifier 128 is coupled to the plus input of differential amplifier 150 (via closed Ph2 switch 134), and the minus output of differential amplifier 128 is coupled to the minus input of differential amplifier 150 (via closed Ph2 switch 140). Also, the second terminal of Ch 132 is coupled to a reference (e.g. ground) via closed Ph2 switch 120, and the second terminal of Ch 142 is coupled to the reference (e.g. ground) via closed Ph2 switch 122. During the gain phase, Vout is held at the same voltage as Voa_out.

Therefore, similar to circuit 10 as was described in reference to the waveforms of FIG. 4, note that waveform Voa_out holds its voltage value during the gain phases, and tracks amplified Vin (having a gain represented by C1/C2) during the sampling phases. Vout of circuit 100, however, due to switches 152 and 154 which are only closed during the holding phases holds its voltage value during both the gain phase and the sampling phase, in which, at the end of the sampling phase, tracks the amplified Vin before being held again during the next gain phase. Note that in a prior art gain configuration circuit which utilizes negative integration, the output of the operational amplifier (similar to Voa_out_negative_integration of FIG. 4) also holds its voltage value during the gain phases, as does Voa_out; but, during the sampling phases, the waveform tracks the inverse of the amplified Vin (i.e. –(C1/C2)Vin), thus causing the voltage to diverge from Vin. Therefore, at the end of each sampling phase, the output must return to the amplified Vin to hold the current voltage value of the amplified Vin again. This return is more difficult for an operational amplifier to handle, requiring extra power and area, as compared to the smaller return at the transition of the sampling phase to the gain phase of Voa_out of the embodiment of FIG. 5. Therefore, note that the circuit of FIG. 5 may allow for improved operation while allowing for reduced area and power as compared to the prior art operational amplifiers within the gain enhanced switched capacitor circuit. For example, the circuit of FIG. 5 may reduce the slew rate requirement of operational amplifier 156 during the transition from the sampling to holding phase, thus reducing power.

In each of FIGS. 5-7, operational amplifier 156 is illustrated as having 2 stages, a first one corresponding to differential amplifier 128 and a second corresponding to differential amplifier 150. As described above with respect to operational amplifier 56, similar modification can be made to operational amplifier 156 such that any number of stages (i.e. one or more stages) may be used to implement operational amplifier 156.

By now it should be appreciated that there has been provided a gain enhanced switch capacitor circuit which may allow for a reduced slew rate requirement of the operational amplifier. For example, in one embodiment, during the sampling phase, the inputs to the operational amplifier may be cross coupled (while connections within the operational amplifier may be cross coupled as well to maintain negative feedback.) Therefore, since the slew rate requirement may be reduced, the circuit can be operated at higher speeds or, alternatively, power consumption can be reduced.

Also, note that although the gain enhanced switch capacitor circuit described herein has been described in reference to either a buffer configuration or a gain configuration, it may be used in a variety of other configurations or applications. For example, the technique of cross-coupling the inputs to the operational amplifier during the sampling phase may also be used in switched capacitor integrators, filters, summers, etc. Therefore, in any application in which a gain enhanced switch capacitor circuit may be used, the techniques described herein can be applied to possibly allow for a reduced slew rate requirement of the operational amplifier which may allow the circuit to operate at higher speeds or at lower power.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, any number of stages (one or more) can be used to implement operational amplifier 56 or 156. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of operating a circuit in response to a pair of differential signals in which the circuit has a first differential amplifier, a second differential amplifier, a first capacitor, a second capacitor, a third capacitor, and a fourth capacitor, wherein a first terminal of the first capacitor is coupled to a plus input of the first differential amplifier; a first terminal of the second capacitor is coupled to a minus input of the first differential amplifier; a first terminal of the third capacitor is coupled to a minus output of the second differential amplifier; and a first terminal of the fourth capacitor is coupled to a plus output of the second differential amplifier. The method includes, during a sampling mode of the circuit: coupling a first signal of the pair of differential signals to a second terminal of the first capacitor; coupling a second signal of the pair of differential signals to a second terminal of the second capacitor; coupling the plus input of the first differential amplifier to a second terminal of the fourth capacitor; coupling the minus input of the first differential amplifier to a second terminal of the third capacitor; coupling a plus output of the first differential amplifier to a minus input of the second differential amplifier; and coupling a minus output of the first differential amplifier to a plus input of the second differential amplifier. The method also includes, during a hold mode of the circuit: decoupling the first signal from the second terminal of the first capacitor; decoupling the second signal from the second terminal of the second capacitor; decoupling the plus input of the first differential amplifier from the second terminal of the fourth capacitor; decoupling the minus input of the first differential amplifier from the second terminal of the third capacitor; decoupling the plus output of the first differential amplifier from the minus input of the second differential amplifier; decoupling the minus output of the first differential amplifier from the plus input of the second differential amplifier; coupling the second terminal of the first capacitor to the minus output of the second differential amplifier; coupling the second terminal of the second capacitor to the plus output of the second differential amplifier; coupling the second terminal of the fourth capacitor to a reference terminal; coupling the second terminal of the third capacitor to the reference terminal; coupling the plus output of the first differential amplifier to the plus input of the second differential amplifier; and coupling the minus output of the first differential amplifier to the minus input of the second differential amplifier. Item 2 includes the method of item 1, wherein the step of decoupling the minus output of the first differential amplifier from the plus input of the second differential amplifier occurs prior to the step of coupling the minus output of the first differential amplifier to the minus input of the second differential amplifier. Item 3 includes the method of item 1, wherein the step of coupling the second terminal of the fourth capacitor to a reference terminal occurs before the step of coupling the second terminal of the first capacitor to the minus output of the second differential amplifier. Item 4 includes the method of item 1, and further includes, during the sampling mode of the circuit: decoupling the second terminal of the first capacitor from the minus output of the second differential amplifier; decoupling the second terminal of the second capacitor from the plus output of the second differential amplifier; decoupling the second terminal of the fourth capacitor from a reference terminal; decoupling the second terminal of the third capacitor from the reference terminal; decoupling the plus output of the first differential amplifier from the plus input of the second differential amplifier; and decoupling the minus output of the first differential amplifier from the minus input of the second differential amplifier. Item 5 includes the method of item 4, wherein the decoupling the second terminal of the third capacitor from the reference terminal occurs prior to the decoupling the second terminal of the first capacitor 16 from the minus output of the second differential amplifier. Item 6 includes the method of item 1, wherein the reference terminal is ground. Item 7 includes the method of item 1, wherein the circuit has a plus output and a minus output, and the method further includes coupling the minus output of the second differential amplifier to the plus output of the circuit during the hold mode; and coupling the plus output of the second differential amplifier to the minus output of the circuit during the hold mode.

Item 8 includes a method of operating a circuit in response to a pair of differential signals in which the circuit has a first differential amplifier, a second differential amplifier, a first capacitor, a second capacitor, a third capacitor, a fourth capacitor, a fifth capacitor, and a sixth capacitor, wherein a first terminal of the first capacitor is coupled to a plus input of the first differential amplifier; a first terminal of the second capacitor is coupled to a minus input of the first differential amplifier; a first terminal of the third capacitor is coupled to a minus output of the second differential amplifier; a first terminal of the fourth capacitor is coupled to a plus output of the second differential amplifier; a first terminal of the fifth capacitor is coupled to the plus input of the first differential amplifier; and a first terminal of the sixth capacitor is coupled to the minus input of the first differential amplifier. The method includes, during a sampling mode of the circuit: coupling a first signal of the pair of differential signals to a second terminal of the first capacitor; coupling a second signal of the pair of differential signals to a second terminal of the second capacitor; coupling the plus input of the first differential amplifier to a second terminal of the fourth capacitor; coupling the minus input of the first differential amplifier to a second terminal of the third capacitor; coupling a plus output of the first differential amplifier to a minus input of the second differential amplifier; coupling a minus output of the first differential amplifier to a plus input of the second differential amplifier; coupling a second terminal of the fifth capacitor to the reference terminal; and coupling a second terminal of the sixth capacitor to the reference terminal. During the hold mode, the method includes: decoupling the first signal from the second terminal of the first capacitor; decoupling the second signal from the second terminal of the second capacitor; decoupling the plus input of the first differential amplifier from the second terminal of the fourth capacitor; decoupling the minus input of the first differential amplifier from the second terminal of the third capacitor; decoupling the plus output of the first differential amplifier from the minus input of the second differential amplifier; decoupling the minus output of the first differential amplifier from the plus input of the second differential amplifier; decoupling the second terminal of the fifth capacitor from the reference terminal; decoupling the second terminal of the sixth capacitor from the reference terminal; coupling the first terminal of the of the first capacitor to the reference terminal; coupling the first terminal of the of the second capacitor to the reference terminal; coupling the second terminal of the fifth capacitor to the minus output of the second differential amplifier; and coupling the second terminal of the sixth capacitor to the plus output of the second differential amplifier. Item 9 includes the method of item 8, wherein the reference terminal comprises ground. Item 10 includes the method of item 8, wherein the circuit has a plus output and a minus output, and the method further includes coupling the minus output of the second differential amplifier to the plus output of the circuit during the hold mode; and coupling the plus output of the second differential amplifier to the minus output of the circuit during the hold mode. Item 11 includes the method of item 8, wherein the step of decoupling the minus output of the first differential amplifier from the plus input of the second differential amplifier occurs prior to the step of coupling the minus output of the first differential amplifier to the minus input of the second differential amplifier. Item 12 includes the method of item 8, wherein the step of coupling the second terminal of the fourth capacitor to a reference terminal occurs before the step of coupling the second terminal of the sixth capacitor to the plus output of the second differential amplifier. Item 13 includes the method of item 8, further including, during the sampling mode of the circuit: decoupling the first terminal of the of the first capacitor from the reference terminal; decoupling the first terminal of the of the second capacitor from the reference terminal; decoupling the second terminal of the fifth capacitor from the minus output of the second differential amplifier; and decoupling the second terminal of the sixth capacitor from the plus output of the second differential amplifier. Item 14 includes the method of item 13, wherein the step of decoupling the first terminal of the first capacitor from the reference terminal occurs prior to the step of decoupling the second terminal of the fifth capacitor from the minus output of the second differential amplifier.

Item 15 includes a circuit including a first differential amplifier having a plus input, a minus input, a plus output, and a minus output; a second differential amplifier having a plus input, a minus input, a plus output, and a minus output; a first switch having a first terminal for receiving a first signal of a pair of differential signals and a second terminal, wherein the first switch is open during a hold mode and closed during a sampling mode; a first capacitor having a first terminal coupled to the second terminal of the first switch and a second terminal coupled to the plus input of the first differential amplifier; a second switch having a first terminal for receiving a second signal of a pair of differential signals and a second terminal, wherein the second switch is open during a hold mode and closed during a sampling mode; a second capacitor having a first terminal coupled to the second terminal of the second switch and a second terminal coupled to the minus input of the first differential amplifier; a third switch having a first terminal coupled to the minus input of the first differential amplifier and a second terminal, wherein the third switch is open during a hold mode and closed during a sampling mode; a fourth switch having a first terminal coupled to the second terminal of the third switch and a second terminal coupled to a reference terminal, wherein the fourth switch is open during the sampling mode and closed during the hold mode; a third capacitor having a first terminal coupled to the second terminal of the third switch and a second terminal coupled to the minus output of the second differential amplifier; a fifth switch having a first terminal coupled to the first terminal of the first capacitor and a second terminal coupled to the minus output of the second differential amplifier, wherein the fifth switch is closed during a hold mode and open during a sampling mode; a sixth switch having a first terminal coupled to the plus input of the first differential amplifier and a second terminal, wherein the sixth switch is open during a hold mode and closed during a sampling mode; a seventh switch having a first terminal coupled to the second terminal of the sixth switch and a second terminal coupled to a reference terminal, wherein the seventh switch is closed during a hold mode and open during a sampling mode; a fourth capacitor having a first terminal coupled to the second terminal of the sixth switch and a second terminal coupled to the plus output of the second differential amplifier; an eighth switch having a first terminal coupled to the first terminal of the second capacitor and a second terminal coupled to the plus output of the second differential amplifier, wherein the eighth switch is closed during a hold mode and open during a sampling mode; a ninth switch having a first terminal coupled to the plus output of the first differential amplifier and a second terminal coupled to the minus input of the second differential amplifier, wherein the second switch is open during a hold mode and closed during a sampling mode; a tenth switch having a first terminal coupled to the plus output of the first differential amplifier and a second terminal coupled to the plus input of the second differential amplifier, wherein the tenth switch is closed during a hold mode and open during a sampling mode; an eleventh switch having a first terminal coupled to the minus output of the first differential amplifier and a second terminal coupled to the plus input of the second differential amplifier, wherein the second switch is open during a hold mode and closed during a sampling mode; and a twelfth switch having a first terminal coupled to the minus output of the first differential amplifier and a second terminal coupled to the minus input of the second differential amplifier, wherein the tenth switch is closed during a hold mode and open during a sampling mode. Item 16 includes the circuit of item 15 and further includes a thirteenth switch having a first terminal coupled to the minus output of the second differential amplifier and a second terminal as a plus output of the circuit, wherein thirteenth switch is closed during a hold mode and open during a sampling mode; and a fourteenth switch having a first terminal coupled to the plus output of the second differential amplifier and a second terminal as a minus output of the circuit, wherein fourteenth switch is closed during a hold mode and open during a sampling mode. Item 17 includes the circuit of item 15, wherein during a transition from the hold mode to the sampling mode, the twelfth switch is opened before the ninth switch is closed. Item 18 includes the circuit of item 15, wherein during a transition from the sampling mode to the hold mode, the ninth switch is opened before the twelfth switch is closed. Item 19 includes the circuit of item 15, wherein the reference terminal is ground. Item 20 includes the circuit of item 15, wherein during a transition from the sampling mode to the hold mode the seventh switch is closed before the eighth switch is closed.

What is claimed is:

1. A method of operating a circuit in response to a pair of differential signals in which the circuit has a first differential amplifier, a second differential amplifier, a first capacitor, a second capacitor, a third capacitor, and a fourth capacitor, wherein
   a first terminal of the first capacitor is coupled to a plus input of the first differential amplifier;
   a first terminal of the second capacitor is coupled to a minus input of the first differential amplifier;
   a first terminal of the third capacitor is coupled to a minus output of the second differential amplifier;
   a first terminal of the fourth capacitor is coupled to a plus output of the second differential amplifier;
   the method comprising:
   during a sampling mode of the circuit:
      coupling a first signal of the pair of differential signals to a second terminal of the first capacitor;
      coupling a second signal of the pair of differential signals to a second terminal of the second capacitor;
      coupling the plus input of the first differential amplifier to a second terminal of the fourth capacitor;
      coupling the minus input of the first differential amplifier to a second terminal of the third capacitor;
      coupling a plus output of the first differential amplifier to a minus input of the second differential amplifier; and
      coupling a minus output of the first differential amplifier to a plus input of the second differential amplifier; and
   during a hold mode of the circuit:
      decoupling the first signal from the second terminal of the first capacitor;
      decoupling the second signal from the second terminal of the second capacitor;
      decoupling the plus input of the first differential amplifier from the second terminal of the fourth capacitor;
      decoupling the minus input of the first differential amplifier from the second terminal of the third capacitor;
      decoupling the plus output of the first differential amplifier from the minus input of the second differential amplifier;
      decoupling the minus output of the first differential amplifier from the plus input of the second differential amplifier;
      coupling the second terminal of the first capacitor to the minus output of the second differential amplifier;
      coupling the second terminal of the second capacitor to the plus output of the second differential amplifier;
      coupling the second terminal of the fourth capacitor to a reference terminal;
      coupling the second terminal of the third capacitor to the reference terminal;
      coupling the plus output of the first differential amplifier to the plus input of the second differential amplifier; and
      coupling the minus output of the first differential amplifier to the minus input of the second differential amplifier.

2. The method of claim 1, wherein the step of decoupling the minus output of the first differential amplifier from the plus input of the second differential amplifier occurs prior to the step of coupling the minus output of the first differential amplifier to the minus input of the second differential amplifier.

3. The method of claim 1, wherein the step of coupling the second terminal of the fourth capacitor to a reference terminal occurs before the step of coupling the second terminal of the first capacitor to the minus output of the second differential amplifier.

4. The method of claim 1, further comprising, during the sampling mode of the circuit:
   decoupling the second terminal of the first capacitor from the minus output of the second differential amplifier;
   decoupling the second terminal of the second capacitor from the plus output of the second differential amplifier;
   decoupling the second terminal of the fourth capacitor from a reference terminal;
   decoupling the second terminal of the third capacitor from the reference terminal;
   decoupling the plus output of the first differential amplifier from the plus input of the second differential amplifier; and
   decoupling the minus output of the first differential amplifier from the minus input of the second differential amplifier.

5. The method of claim 4, wherein the decoupling the second terminal of the third capacitor from the reference terminal occurs prior to the decoupling the second terminal of the first capacitor 16 from the minus output of the second differential amplifier.

6. The method of claim 1, wherein the reference terminal is ground.

7. The method of claim 1, wherein the circuit has a plus output and a minus output, further comprising:
coupling the minus output of the second differential amplifier to the plus output of the circuit during the hold mode; and
coupling the plus output of the second differential amplifier to the minus output of the circuit during the hold mode.

8. A method of operating a circuit in response to a pair of differential signals in which the circuit has a first differential amplifier, a second differential amplifier, a first capacitor, a second capacitor, a third capacitor, a fourth capacitor, a fifth capacitor, and a sixth capacitor, wherein
a first terminal of the first capacitor is coupled to a plus input of the first differential amplifier;
a first terminal of the second capacitor is coupled to a minus input of the first differential amplifier;
a first terminal of the third capacitor is coupled to a minus output of the second differential amplifier;
a first terminal of the fourth capacitor is coupled to a plus output of the second differential amplifier;
a first terminal of the fifth capacitor is coupled to the plus input of the first differential amplifier; and
a first terminal of the sixth capacitor is coupled to the minus input of the first differential amplifier;
the method comprising:
during a sampling mode of the circuit:
coupling a first signal of the pair of differential signals to a second terminal of the first capacitor;
coupling a second signal of the pair of differential signals to a second terminal of the second capacitor;
coupling the plus input of the first differential amplifier to a second terminal of the fourth capacitor;
coupling the minus input of the first differential amplifier to a second terminal of the third capacitor;
coupling a plus output of the first differential amplifier to a minus input of the second differential amplifier;
coupling a minus output of the first differential amplifier to a plus input of the second differential amplifier;
coupling a second terminal of the fifth capacitor to the reference terminal; and
coupling a second terminal of the sixth capacitor to the reference terminal; and
during the hold mode:
decoupling the first signal from the second terminal of the first capacitor;
decoupling the second signal from the second terminal of the second capacitor;
decoupling the plus input of the first differential amplifier from the second terminal of the fourth capacitor;
decoupling the minus input of the first differential amplifier from the second terminal of the third capacitor;
decoupling the plus output of the first differential amplifier from the minus input of the second differential amplifier;
decoupling the minus output of the first differential amplifier from the plus input of the second differential amplifier;
decoupling the second terminal of the fifth capacitor from the reference terminal;
decoupling the second terminal of the sixth capacitor from the reference terminal;
coupling the first terminal of the of the first capacitor to the reference terminal;
coupling the first terminal of the of the second capacitor to the reference terminal;
coupling the second terminal of the fifth capacitor to the minus output of the second differential amplifier; and
coupling the second terminal of the sixth capacitor to the plus output of the second differential amplifier.

9. The method of claim 8, wherein the reference terminal comprises ground.

10. The method of claim 8, wherein the circuit has a plus output and a minus output, further comprising:
coupling the minus output of the second differential amplifier to the plus output of the circuit during the hold mode; and
coupling the plus output of the second differential amplifier to the minus output of the circuit during the hold mode.

11. The method of claim 8, wherein the step of decoupling the minus output of the first differential amplifier from the plus input of the second differential amplifier occurs prior to the step of coupling the minus output of the first differential amplifier to the minus input of the second differential amplifier.

12. The method of claim 8, wherein the step of coupling the second terminal of the fourth capacitor to a reference terminal occurs before the step of coupling the second terminal of the sixth capacitor to the plus output of the second differential amplifier.

13. The method of claim 8, further comprising, during the sampling mode of the circuit:
decoupling the first terminal of the of the first capacitor from the reference terminal;
decoupling the first terminal of the of the second capacitor from the reference terminal;
decoupling the second terminal of the fifth capacitor from the minus output of the second differential amplifier; and
decoupling the second terminal of the sixth capacitor from the plus output of the second differential amplifier.

14. The method of claim 13, wherein the step of decoupling the first terminal of the first capacitor from the reference terminal occurs prior to the step of decoupling the second terminal of the fifth capacitor from the minus output of the second differential amplifier.

15. A circuit, comprising:
a first differential amplifier having a plus input, a minus input, a plus output, and a minus output;
a second differential amplifier having a plus input, a minus input, a plus output, and a minus output;
a first switch having a first terminal for receiving a first signal of a pair of differential signals and a second terminal, wherein the first switch is open during a hold mode and closed during a sampling mode;
a first capacitor having a first terminal coupled to the second terminal of the first switch and a second terminal coupled to the plus input of the first differential amplifier;
a second switch having a first terminal for receiving a second signal of a pair of differential signals and a second terminal, wherein the second switch is open during a hold mode and closed during a sampling mode;
a second capacitor having a first terminal coupled to the second terminal of the second switch and a second terminal coupled to the minus input of the first differential amplifier;
a third switch having a first terminal coupled to the minus input of the first differential amplifier and a second terminal, wherein the third switch is open during a hold mode and closed during a sampling mode;

a fourth switch having a first terminal coupled to the second terminal of the third switch and a second terminal coupled to a reference terminal, wherein the fourth switch is open during the sampling mode and closed during the hold mode;

a third capacitor having a first terminal coupled to the second terminal of the third switch and a second terminal coupled to the minus output of the second differential amplifier;

a fifth switch having a first terminal coupled to the first terminal of the first capacitor and a second terminal coupled to the minus output of the second differential amplifier, wherein the fifth switch is closed during a hold mode and open during a sampling mode;

a sixth switch having a first terminal coupled to the plus input of the first differential amplifier and a second terminal, wherein the sixth switch is open during a hold mode and closed during a sampling mode;

a seventh switch having a first terminal coupled to the second terminal of the sixth switch and a second terminal coupled to a reference terminal, wherein the seventh switch is closed during a hold mode and open during a sampling mode;

a fourth capacitor having a first terminal coupled to the second terminal of the sixth switch and a second terminal coupled to the plus output of the second differential amplifier;

an eighth switch having a first terminal coupled to the first terminal of the second capacitor and a second terminal coupled to the plus output of the second differential amplifier, wherein the eighth switch is closed during a hold mode and open during a sampling mode;

a ninth switch having a first terminal coupled to the plus output of the first differential amplifier and a second terminal coupled to the minus input of the second differential amplifier, wherein the second switch is open during a hold mode and closed during a sampling mode;

a tenth switch having a first terminal coupled to the plus output of the first differential amplifier and a second terminal coupled to the plus input of the second differential amplifier, wherein the tenth switch is closed during a hold mode and open during a sampling mode;

an eleventh switch having a first terminal coupled to the minus output of the first differential amplifier and a second terminal coupled to the plus input of the second differential amplifier, wherein the second switch is open during a hold mode and closed during a sampling mode; and a twelfth switch having a first terminal coupled to the minus output of the first differential amplifier and a second terminal coupled to the minus input of the second differential amplifier, wherein the twelfth switch is closed during a hold mode and open during a sampling mode.

16. The circuit of claim 15, further comprising:

a thirteenth switch having a first terminal coupled to the minus output of the second differential amplifier and a second terminal as a plus output of the circuit, wherein thirteenth switch is closed during a hold mode and open during a sampling mode; and a fourteenth switch having a first terminal coupled to the plus output of the second differential amplifier and a second terminal as a minus output of the circuit, wherein fourteenth switch is closed during a hold mode and open during a sampling mode.

17. The circuit of claim 15, wherein during a transition from the hold mode to the sampling mode, the twelfth switch is opened before the ninth switch is closed.

18. The circuit of claim 15, wherein during a transition from the sampling mode to the hold mode, the ninth switch is opened before the twelfth switch is closed.

19. The circuit of claim 15, wherein the reference terminal is ground.

20. The circuit of claim 15, wherein during a transition from the sampling mode to the hold mode the seventh switch is closed before the eighth switch is closed.

* * * * *